(12) United States Patent
Rubenstein et al.

(10) Patent No.: US 9,019,704 B2
(45) Date of Patent: Apr. 28, 2015

(54) HEAT STORAGE BY PHASE-CHANGE MATERIAL

(75) Inventors: Brandon Rubenstein, Loveland, CO (US); Roy Zeighami, McKinney, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 667 days.

(21) Appl. No.: 13/386,138

(22) PCT Filed: Aug. 27, 2009

(86) PCT No.: PCT/US2009/055112
§ 371 (c)(1),
(2), (4) Date: Jan. 20, 2012

(87) PCT Pub. No.: WO2011/025487
PCT Pub. Date: Mar. 3, 2011

(65) Prior Publication Data
US 2012/0125573 A1    May 24, 2012

(51) Int. Cl.
| H05K 7/20 | (2006.01) |
| H01L 23/427 | (2006.01) |
| F28D 15/00 | (2006.01) |
| F28D 20/02 | (2006.01) |
| F28F 3/12 | (2006.01) |
| H01L 23/473 | (2006.01) |

(52) U.S. Cl.
CPC ............ *H01L 23/4275* (2013.01); *F28D 15/00* (2013.01); *F28D 20/02* (2013.01); *F28F 3/12* (2013.01); *H01L 23/473* (2013.01); *Y02E 60/145* (2013.01); *F28F 2265/10* (2013.01); *H01L 2924/0002* (2013.01)

(58) Field of Classification Search
USPC .......... 361/679.46, 679.48–679.54, 688, 689, 361/690–719; 165/80.2, 80.3, 80.4, 80.5, 165/104.17, 104.33, 104.2, 104.21, 104.34, 165/902, 10; 62/259.2, 259.3, 457.2, 457.9, 62/3, 3.3; 174/15.1, 16.1, 16.3, 252; 257/706–727
See application file for complete search history.

(56) References Cited

U.S. PATENT DOCUMENTS

| 6,307,871 B1 * | 10/2001 | Heberle .......................... 372/34 |
| 6,397,618 B1 * | 6/2002 | Chu et al. ..................... 62/259.2 |
| 7,433,190 B2 * | 10/2008 | Kehl et al. ..................... 361/700 |
| 7,646,606 B2 * | 1/2010 | Rytka et al. ................... 361/704 |
| 7,874,173 B2 * | 1/2011 | Yasuo .......................... 62/259.2 |
| 7,882,888 B1 * | 2/2011 | Bugby et al. ............. 165/104.14 |
| 2002/0024221 A1 * | 2/2002 | Grewe et al. ................ 290/40 C |
| 2002/0033247 A1 | 3/2002 | Neuschutz et al. |
| 2005/0269063 A1 | 12/2005 | Zuo et al. |
| 2005/0279491 A1 | 12/2005 | Thome et al. |

(Continued)

FOREIGN PATENT DOCUMENTS

JP    02007155269 A   *  6/2007  ............. F25B 21/00

*Primary Examiner* — Michail V Datskovskiy
(74) *Attorney, Agent, or Firm* — Hewlett-Packard Patent Department

(57) ABSTRACT

Methods and means related to rejecting heat through thermal storage are provided. A heat sink includes internal cavities containing a phase-change material. Heat from a thermal load is rejected by flowing fluid coolant at a normal operating temperature. Failure of the fluid coolant system causes heat storage within the phase-change material at a temperature slightly greater than the normal operating temperature. Restoration of the fluid coolant system results in stored heat rejection and a return to a normal operating temperature. Normal operation of the thermal load can be performed while efforts are made to restore the fluid coolant system.

15 Claims, 7 Drawing Sheets

(56) References Cited

U.S. PATENT DOCUMENTS

| | | | |
|---|---|---|---|
| 2006/0042289 A1* | 3/2006 | Campbell et al. | 62/259.2 |
| 2007/0204646 A1 | 9/2007 | Gagliano | |
| 2008/0099187 A1* | 5/2008 | Rini et al. | 165/104.17 |
| 2008/0307806 A1 | 12/2008 | Campbell et al. | |

* cited by examiner

HEAT STORAGE BY PHASE-CHANGE MATERIAL

BACKGROUND

Computers, electronic devices and other modern apparatus are being pushed toward ever increasing performance in accordance with market expectations and other factors. In turn, increasing amounts of heat must be rejected in order for such devices to operate properly. Forced convection through the use of fans, circulatory coolants, and other mechanisms are commonly applied toward these heat rejection requirements.

However, such forced convection systems, like all dynamic contrivances, are subject to occasional failure. None the less, the rejection of heat from a device or system is an ongoing need in order to avoid damage or undesirable shutdown. The present teachings are directed to the foregoing concerns.

BRIEF DESCRIPTION OF THE DRAWINGS

The present embodiments will now be described, by way of example, with reference to the accompanying drawings, in which.

DETAILED DESCRIPTION

Introduction

Means and methods for protecting electronic circuitry and other devices against damage due to overheating are provided by the present teachings. A heat sink, or cool plate, is formed from a thermally conductive material. The heat sink is formed so as to define an internal fluid conduit or pattern of conduits, as well as a number of internal cavities. The internal cavities are isolated and distinct from the fluid conduit(s). A phase-change material is contained within each of the internal cavities. Heat from electronic devices or other thermal loads is rejected by way of a fluid coolant flowing through the heat sink. During times of abnormal operation, heat is stored by way of the phase-change material. The stored heat is later rejected when normal operating conditions resume. Heat storage is performed at an average temperature slightly e.g., a few degrees Fahrenheit) greater than a normal operating temperature.

In one embodiment an apparatus includes a heat sink formed from a thermally conductive material. The apparatus also includes a fluid conduit defined by the heat sink. The fluid conduit is configured to route a flow of coolant through the heat sink from an inlet port to an outlet port. Additionally, at least one internal cavity is defined by the heat sink. The apparatus further includes a phase-change material supported in the at least one internal cavity. The phase-change material is configured to change phase from a solid state to a liquid state at a predetermined heat storage temperature greater than a normal operating temperature.

In another embodiment, a method includes storing heat within a phase-change material of a heat sink. The storing heat is performed during a disruption of a normal flow of coolant through a fluid passageway of the heat sink. The method also includes restoring a normal flow of coolant through the fluid passageway of the heat sink. The method further includes releasing the stored heat from the phase-change material to the normal flow of coolant.

First Illustrative Embodiment

Figure 1A:
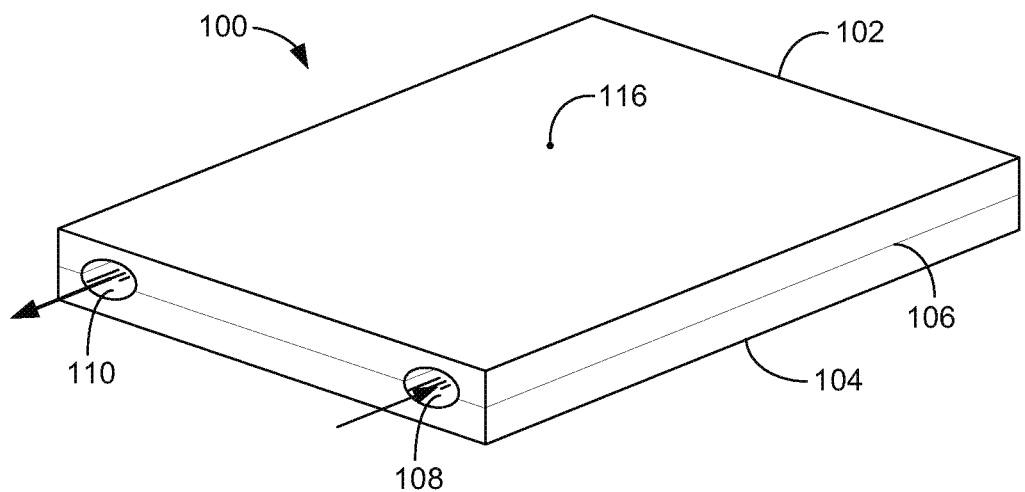
FIG. 1A depicts an isometric view of an apparatus according to one embodiment.
Figure 1B:
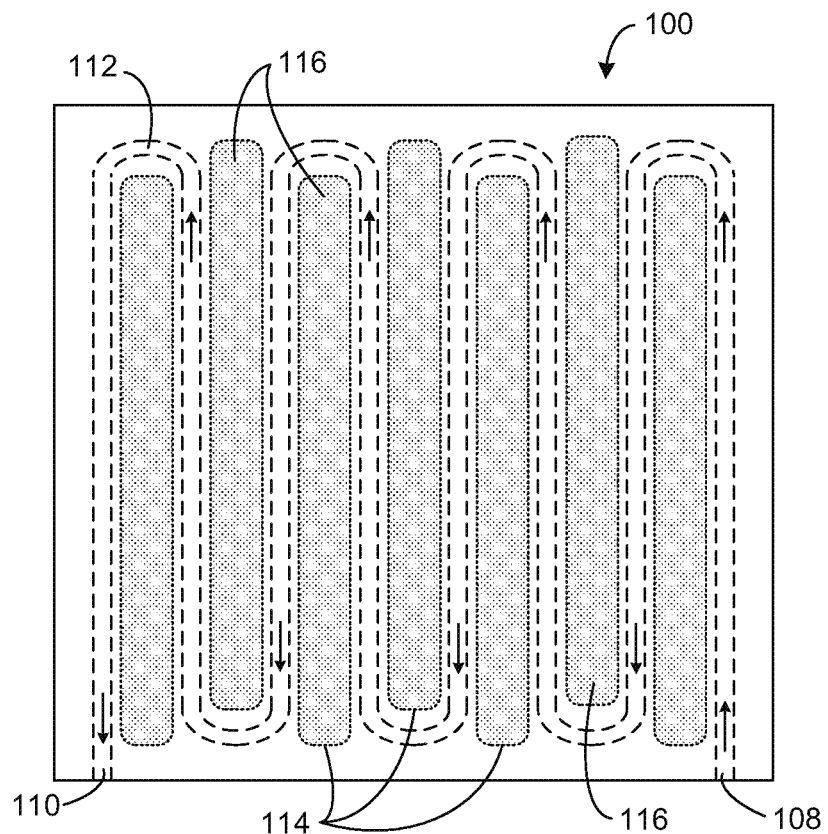
FIG. 1B depicts a plan view of the apparatus of FIG. 1A.

Reference is now directed to FIG. 1A, which depict an isometric view of a heat sink 100, and FIG. 1B, which is a plan view of the heat sink 100. The heat sink 100 is illustrative and non-limiting with respect to the present teachings. Thus, other heat sinks can be configured and/or operated in accordance with the present teachings. The terms "heat sink" and "cool plate" are used interchangeably for purposes of the present teachings.

The heat sink 100 includes an upper portion 102 and a lower portion 104. Each of the upper and lower portions 102 and 104, respectively, are formed or machined from a solid piece of thermally conducive material such as, for non-limiting example, copper, aluminum, brass, etc. Other suitable materials can also be used. The upper and lower portions 102 and 104 are complementary in form such that, when assembled along a join plane 106 as shown, they cooperate to define the respective features of the heat sink 100 as described below.

The heat sink 100 includes, or is formed to define, an inlet port 108 and an outlet port 110. The inlet and outlet ports 108 and 110, respectively, are portions of or are coupled in fluid communication with a fluid conduit 112 (shown in hidden line view). The fluid conduit 112 is defined by forming respective channels in each of the portions 102 and 104. For non-limiting example, milling, machining, laser ablation or other known techniques can be used to form channels in the portions 102 and 104. The respective channels are aligned in an overlapping manner so as to fully define the closed fluid conduit 112 when the heat sink 100 is assembled. The fluid conduit 112 can be circular, rectangular, or any other suitable shape in cross-section.

The fluid conduit 112 is defined such that a fluid coolant traverses a serpentine path through the heat sink 100 from the inlet port 108 to the outlet port 110 as shown by the directional arrows. Non-limiting examples of such fluid coolants include water, alcohol, air, nitrogen gas, etc. Other suitable coolants can also be used. A flow of coolant through the fluid conduit 112 serves to carry heat away from the heat sink 100 by way of forced convection. In another embodiment (not shown), a fluid conduit can be defined in the form of an inlet header and an outlet header with a plurality of parallel fluid passageways there between. Other suitable fluid conduit configurations can also be used.

The heat sink 100 is further formed so as to define a plurality of internal cavities 114. Each of the internal cavities 114 is defined by forming respective half-cavities in the upper and lower portions 102 and 104 of the heat sink 100. Such half-cavities can be formed, for non-limiting example, by milling, machining, laser ablation, etc. Other suitable techniques can also be used. The respective half-cavities are aligned in an overlapping manner so as to fully define the respective internal cavities 114 when the heat sink 100 is assembled. The internal cavities 114 can be circular, rectangular, oval, or any other suitable shape in cross-section or plan. Each of the internal cavities 114 is configured to contain a quantity of phase-change material (PCM) 116. Illustrative and non-limiting examples of such phase-change materials include paraffin, glycol mixtures, formamide, salt and water mixtures, etc. Other suitable phase-change materials can also be used.

The heat sink 100 also defines at least one heat transfer surface 116. The heat sink 100 can define respective heat transfer surfaces 116 on the outward-facing surfaces of the upper portion 102, the lower portion 104, or both. The heat sink 100 receives heat from a heat-dissipating load by way of direct contact (i.e., conduction) with the heat transfer surface 116 or by way of convection or radiation therewith. Normal, illustrative operation of heat sinks according to the present teachings is described below.

First Illustrative System

Figure 2:
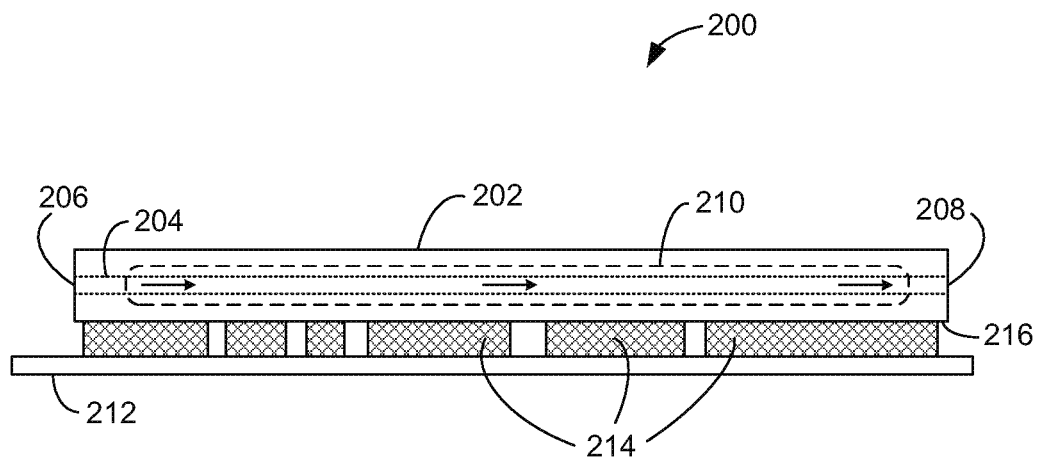
FIG. 2 is a block diagram of a system according to one embodiment.

FIG. 2 is a block diagram depicting a system 200 according to an embodiment of the present teachings. The system 200 is illustrative and non-limiting in nature. As such, other systems are contemplated by the present teachings.

The system 200 includes heat sink (or cool plate) 202. The heat sink 202 is substantially as described above with respect to the heat sink 100. The heat sink 202 defines (or includes) a fluid conduit 204 configured to route a flow of coolant through the heat sink 202 as shown by the directional arrows. Thus, such a flow of coolant enters the heat sink 202 by way of an net portal 206 and exits by way of an outlet portal 208. The heat sink 202 further defines (or includes) a plurality of cavities 210 containing a phase-change material. It is noted that the fluid conduit 204 and the cavities 210 are generally coplanar—that is, they are respectively centered at about the same elevation within the heat sink 202.

The system 200 also includes a circuit board or substrate 212. The circuit board 212 bears (or supports) a plurality of heat-dissipating components (components) 214. Non-limiting examples of the heat-dissipating components 214 include microprocessors, memory devices, micro electro-mechanical systems (MEMS), network communications devices, laser emitters, radio-frequency components, integrated circuits, etc. Each of the components 214 produces some respective amount of heat that must be rejected in order to sustain proper operation. The components 214 are in direct, thermally conductive contact with a heat transfer surface 216 of the heat sink 202.

Normal illustrative operation of the system 200 is a follows: components 214 of the circuit board 212 operate according to their various functions. Heat is dissipated from each of components 214 and is conducted to the heat sink 202 through the heat transfer surface 216. In turn, a fluid coolant flows through the fluid conduit 204 of the heat sink 202. Heat is rejected from the heat sink 202 by way of the flow of coolant and thermal equilibrium is generally maintained at some normal, acceptable operating temperature. Phase-change material within the cavities 210 is preserved in a solid state during operation at the normal temperature.

It is assumed that a disruption now occurs with respect to the fluid coolant. Such a disruption may take the form of a reduction or stoppage of coolant flow, a rise in temperature of the coolant entering the heat sink 202, etc. The result of this disruption is that the heat flux into the heat sink 202 exceeds heat flux (rejection) from the heat sink 202, and the temperature of the heat sink 202 begins to rise above the normal operating temperature.

The temperature of the phase-change material within the cavities 210 also begins to rise with that of the heat sink 202. It is further assumed that the temperature eventually rises to the temperature of fusion for the phase-change material. At that point, the phase-change material begins to store heat by transitioning from solid to liquid state. During this heat storage period, the heat sink 202 exhibits thermal equilibrium at a new temperature just a few degrees greater than the normal operating temperature.

This new temperature is referred to herein as the heat storage temperature for the heat sink 202. In one embodiment, the heat storage temperature is about five degrees Fahrenheit greater than the normal operating temperature for the heat sink 202. Other heat storage/normal operating temperatures or differentials can also be used. The heat sink 202 can generally maintain equilibrium at the heat storage temperature until the entire mass of phase-change material within the cavities 210 as changed from solid to liquid state.

It is now assumed that the flow of coolant is returned to normal. Heat is now rejected from the heat sink 202 by way of the flowing coolant, including heat stored within the phase-change material. As such, heat is transferred to the coolant until all of phase-change material has returned from liquid to solid state. Thereafter, the heat sink 202 is assumed to transition from the heat storage temperature back to a lower, normal operating temperature at which thermal equilibrium is achieved.

The heat sink 202 operates to provide a period of time during which heat can be rejected from the components 214 by way of thermal storage in a phase-change material. This time period is determinable though various factors including selection of the phase-change material, total mass of the phase-change material within the heat sink 202, heat flux from the components 214, etc. The heat sink 202 provides an opportunity to safely operate the components 214 while attempting to restore the fluid coolant flow. In the alternative, the heat sink 202 allows for safe shutdown of the components 214 if the fluid coolant system is anticipated to be offline for an extended period.

Second Illustrative System

Figure 3:
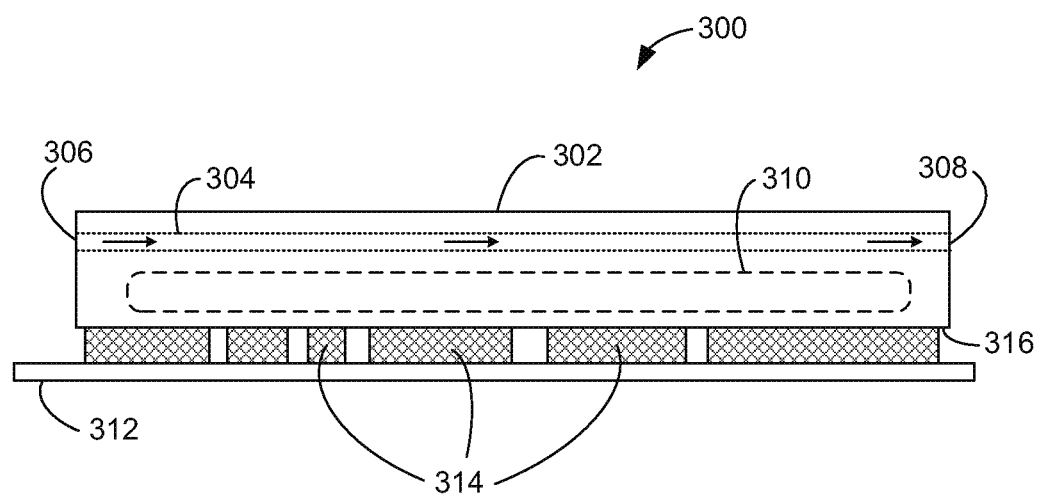
FIG. 3 is a block diagram depicting a system according to one embodiment.

FIG. 3 is a block diagram depicting a system 300 according to an embodiment of the present teachings. The system 300 is illustrative and non-limiting in nature. As such, other systems are contemplated by the present teachings.

The system 300 includes a heat sink (i.e., cool plate) 302. The heat sink 302 includes (defines) a fluid conduit 304, having an inlet port 306 and an outlet port 308 substantially as described above in regard to the heat sink 202. The heat sink 302 further includes (defines) one or more cavities 310 containing a phase-change material. The system 300 also includes a circuit board (or substrate) 312 bearing a plurality of heat-dissipating components 314.

Normal operation of the system 300 is generally the same as described above in regard to the system 200 of FIG. 2. However, it is noted that the fluid conduit 304 and the one or more cavities 310 are non-coplanar. That is, the one or more cavities 310 and the phase-change material that they contain are located between a heat transfer surface 316 and the fluid conduit 304. In this way, thermal flux passes through the heat transfer surface 316, through the phase-change material within the cavities 310 and then to a flow of coolant within the fluid conduit 304.

Third Illustrative System

Figure 4:
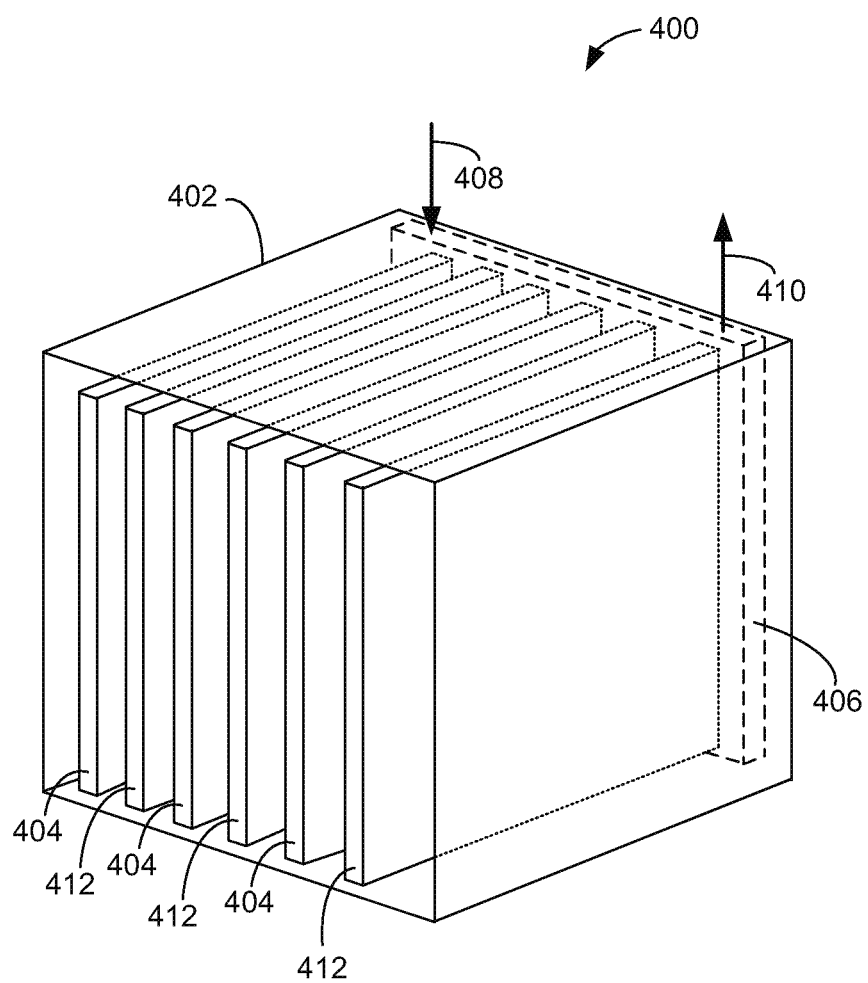
FIG. 4 is an isometric diagrammatic view depicting a system according to another embodiment.

Reference is now directed to FIG. 4, which depicts an isometric block diagrammatic view of a system 400 according to another embodiment. The system 400 is illustrative and non-limiting with respect to the present teachings. Thus, other systems can be configured and/or operated in accordance with the present teachings.

The system 400 includes a server housing 402. The server housing 402 is configured to support a plurality of "blade"-like circuit cards 404. Each of the circuit cards 404 can be defined by a computer, or server. Thus, the server housing 402 can also be referred to as a blade server. The system 400 also includes a heat exchanger 406 disposed within the server housing 402. The heat exchanger 406 is configured to cool the circuit cards 404 by receiving heat flow there from and rejecting that heat by way of forced convection. Inflow coolant 408 enters the heat exchanger 406 and warm, outflow coolant 410 exits the heat exchanger 406 as depicted.

The system 400 also includes a plurality of heat sinks or cool plates 412. Each cool plate 412 is defined by a form factor consistent with that of the circuit cards 404 such that the cool plate 412 can be received and supported within the server housing 402. Each cool plate 412 includes one or more internal cavities (e.g., 114) each containing a phase-change material (e.g., 116). As depicted, each cool plate 412 is in thermally conductive contact with the heat exchanger 406 and remains at normal operating temperature as long as a normal flow of coolant is provided to the heat exchanger 406. While the circuit cards 404 and the cool plates 412 are depicted in an alternating side-by-side sequence, it is to be understood that other respective circuit card 404 or cool plate 412 counts or sequences can also be used.

Figure 5:
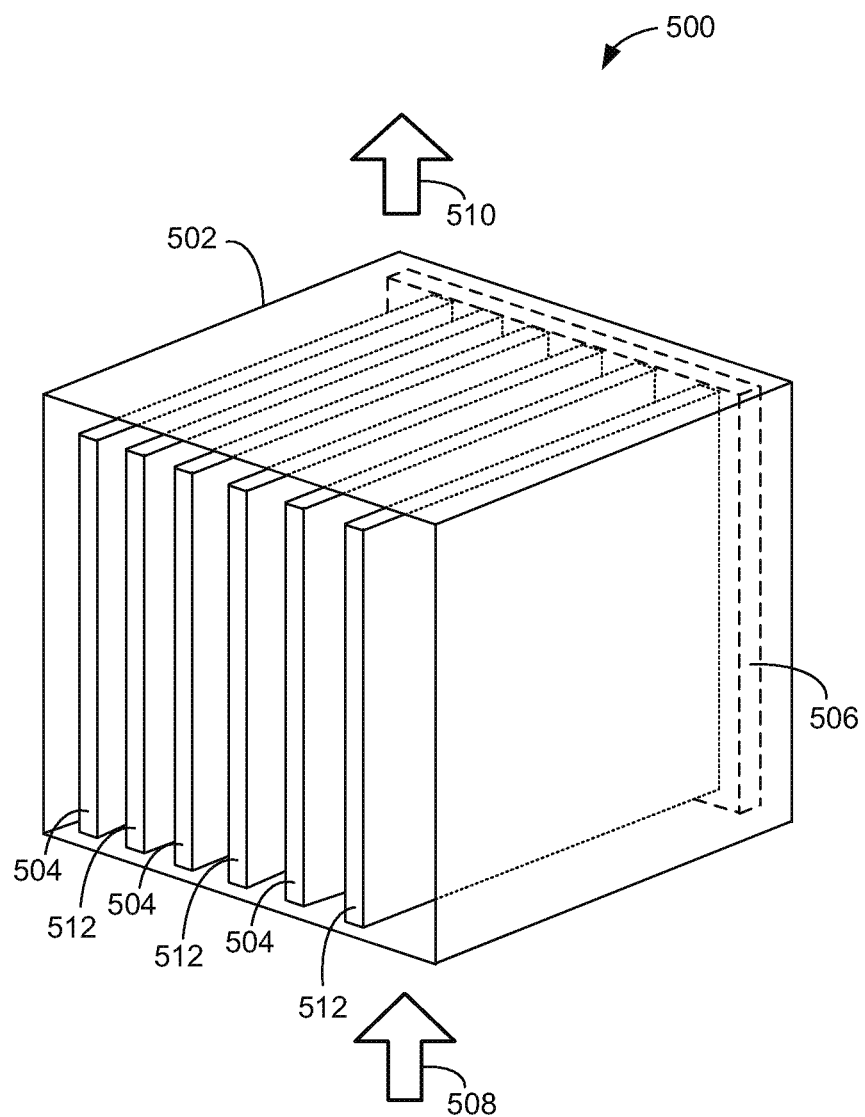
FIG. 5 is an diagrammatic view depicting a system according to yet another embodiment.

In the event of a disruption in the flow of fluid coolant to the heat exchanger 406, the cool plates 412 are configured to receive heat from the operative circuit cards 404. In turn, the phase-change material within each of the cool plates 412 stores thermal energy by transitioning from solid to liquid state at some predetermined heat storage temperature just slightly greater (e.g., five degrees or less) than the normal operating temperature. In this way, the cool plates 412 provide a period of thermal protection of the circuit cards 404 while efforts are made to restore the fluid coolant flow. Once normal, circulatory cooling is reestablished, the cool plates 412 will release stored heat from the phase-change material and return to the normal operating temperature Fourth Illustrative System Reference is now directed to FIG. 5, which depict an isometric block diagrammatic view of a system 500 according to one embodiment. The system 500 is illustrative and non-limiting with respect to the present teachings. Thus, other systems can be configured and/or operated in accordance with the present teachings.

The system 500 includes a server housing 502. The server housing 502 supports a plurality of circuit cards 504 substantially as described above in regard to the system 400. The system 500 also includes a thermally conductive backplane 506. The backplane 506 is configured to perform heat transfer from the circuit cards 504 in the event of a primary cooling system failure as described hereinafter.

A flow of coolant enters the server housing 502 as inflow 508 and exits as outflow 510. The coolant is typically gaseous in nature, but liquids can be used in an appropriate configuration. Non-limiting examples of such coolants include chilled air, nitrogen gas, etc. In this way, heat is rejected from the circuit cards 504 by way of forced convection due to the coolant flow.

The system 500 further includes a plurality of heat sinks or cool plates 512, which are substantially defined and configured as described above with respect to the cool plates 412. Each cool plate 512 includes one or more internal cavities containing a phase-change material. As depicted, each cool plate 512 is in thermally conductive contact with the backplane 506 and remains at normal operating temperature as long a normal flow of coolant is provided to the server housing 502. While the circuit cards 504 and the cool plates 512 are depicted in an alternating side-by-side sequence, it is to be understood that other respective circuit card 504 or cool plate 512 counts or sequences can also be used.

In the event of a disruption in the flow of coolant to the server housing 502, the cool plates 512 are configured to receive heat from the circuit cards 504 by radiation, or by conduction through the backplane 506. In turn, the phase-change material within each of the cool plates 512 stores thermal energy by transitioning from solid to liquid state at some predetermined heat storage temperature. In this way, the cool plates 512 provide a period of thermal protection of the circuit cards 504 while efforts are made to restore normal coolant flow.

In one operating scenario contemplated by the present teachings, the cool plates 412 and 512 are not present within their respective server housings 402 and 502 during normal operations. Rather, such cool plates 412 and 512 are kept in a relatively chilled condition (such as a refrigerator, etc.) and installed into their respective server housings 402 and 502 as needed during times of coolant system failure. Such cool plates 412 and 512 can then be returned to their chilled storage conditions (i.e., refrigerator) after normal coolant flow is restored.

Second Illustrative Embodiment

Figure 6:
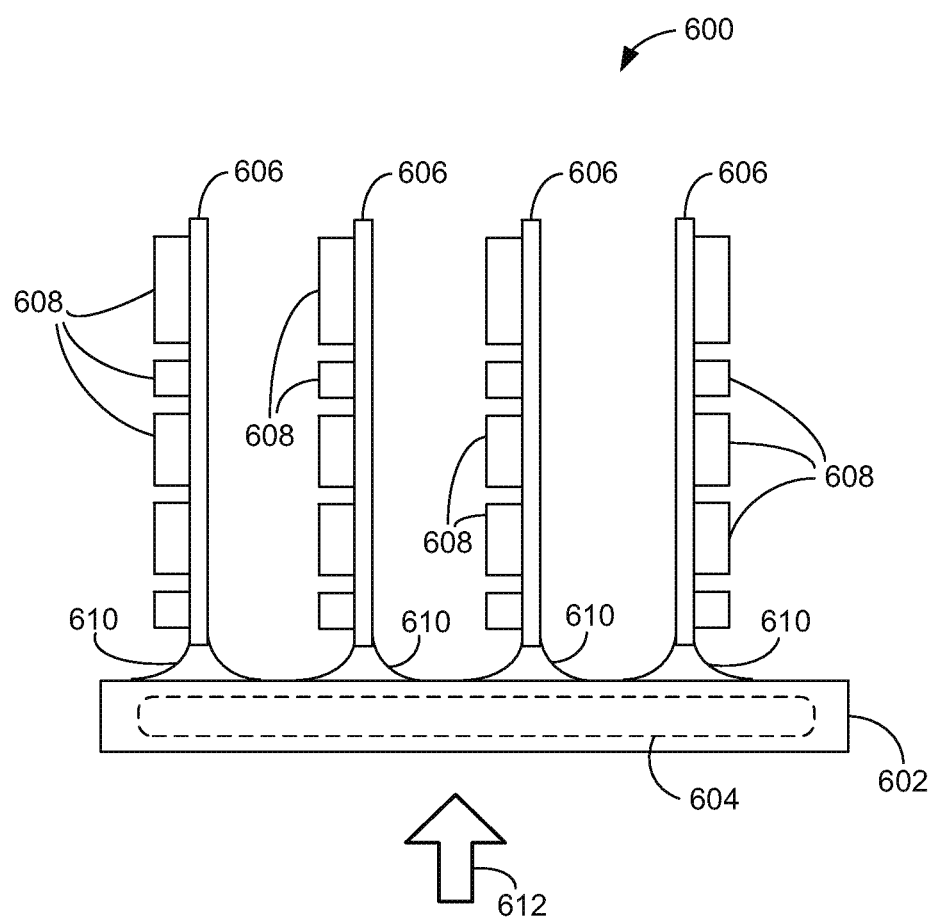
FIG. 6 is a block diagram depicting an apparatus according to one embodiment.

FIG. 6 is a block diagram depicting an apparatus 600 according to one embodiment of the present teachings. The apparatus 600 of is illustrative and non-limiting in nature. Other apparatus can be configured and used in accordance with the present teachings.

The apparatus 600 includes a heat sink (or cool plate) 602. The cool plate 602 is formed from any suitable thermally conductive material such as, for non-limiting example, aluminum, copper, brass, etc. The cool plate 602 includes (or is formed to define) one or more internal cavities 604. Each of the internal cavities 604 contains a phase-change material substantially as described above.

The apparatus 600 also includes a plurality of circuit cards 606. Each of the circuit cards 606 includes a respective plurality of heat-dissipating components 608. Each circuit card 606 also includes heat piping or thermal tracing (not shown) coupled to a thermally conductive contact foot 610.

Figure 7:
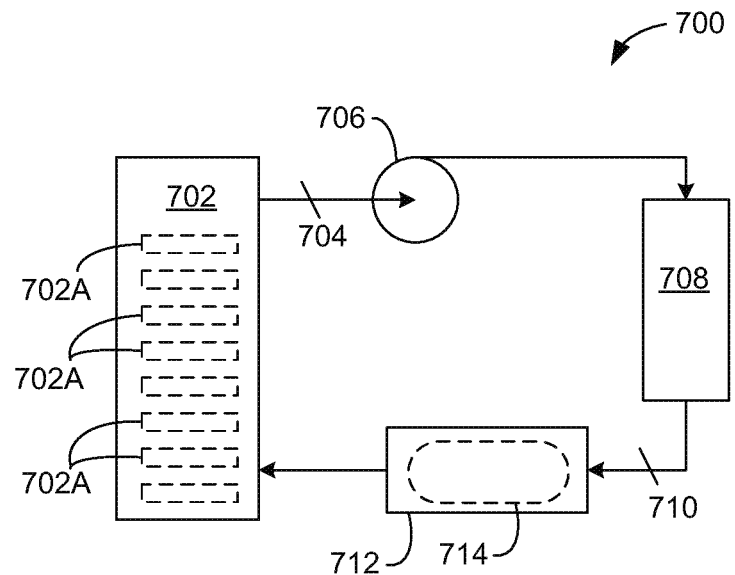
FIG. 7 depicts a block diagram of a system according to one embodiment.

During normal operation, heat is rejected from the circuit cards 606 by forced convection using a surrounding flow 612 of chilled gas (e.g., air, nitrogen, etc.). In the event that the forced convection system fails, heat is conducted away from the circuit cards 606 through the respective contact feet 610 and into the heat sink 602. The phase-change material within the one or more cavities 604 stores the heat by progressively changing from solid to liquid state. Once normal forced convection is restored, the phase-change material will reject the shared heat to the flow of chilled gas and return to the solid state at a normal operating temperature, Fifth Illustrative System FIG. 7 depicts a block diagram of a system 700 according to one embodiment. The system 700 is illustrative and non-limiting with respect to the present teachings. Thus, other systems can be configured and/or operated in accordance with the present teachings.

The system 700 includes a housing 702 including one or more heat-dissipating devices (i.e., thermal loads) 702A. In one embodiment, the housing 702 is a server housing for supporting numerous blade-type computers. The housing 702—or internal fluid conduit there of—discharges a flow of warm fluid coolant 704. Such a fluid coolant can be water, alcohol, etc. The fluid coolant is warmed by heat transfer from the load or loads 702A within the housing 702. Flow of the fluid coolant is driven by a pump 706 of the system 700.

The system 700 also includes a heat exchanger 708. The heat exchanger 708 is configured to cool the fluid coolant by way of heat transfer to another working fluid (not shown), etc. In the alternative, any suitable known process for cooling the fluid coolant can be used. A flow of chilled fluid coolant 710 issues from the heat exchanger 708 as depicted.

The system 700 includes a heat storage device 712 including one or more internal stores of phase-change material 714. The flow of fluid coolant 710 passes through the heat storage device 712 by way of an internal fluid conduit (e.g., 112). The heat storage device 712 is maintained at a normal operating temperature that is less than the fusion temperature (i.e., melting point) of the phase-change material 714. Thus, the phase-change material 714 is in a solid state during normal operations.

In the event that the heat exchanger 708 fails, or there is an unusually high rate of heat transfer from devices 702A of the housing 702, the heat storage device 712 will remove heat from the flow of coolant 710 by way of heat storage within the phase-change material 714. This backup cooling operation will occur at or about a heat storage temperature that is slightly greater than the normal operating temperature. Such heat storage cooling can be provided until all of the phase-change material 714 has changed from solid to liquid state. The heat storage period provides an opportunity to restore normal cooling operations without having to shutdown the heat-dissipating devices 702A. Restoration of normal cooling results in the rejection of heat from the phase-change material 714 and a return to normal operating temperatures within the system 700.

Sixth Illustrative System

Figure 8:
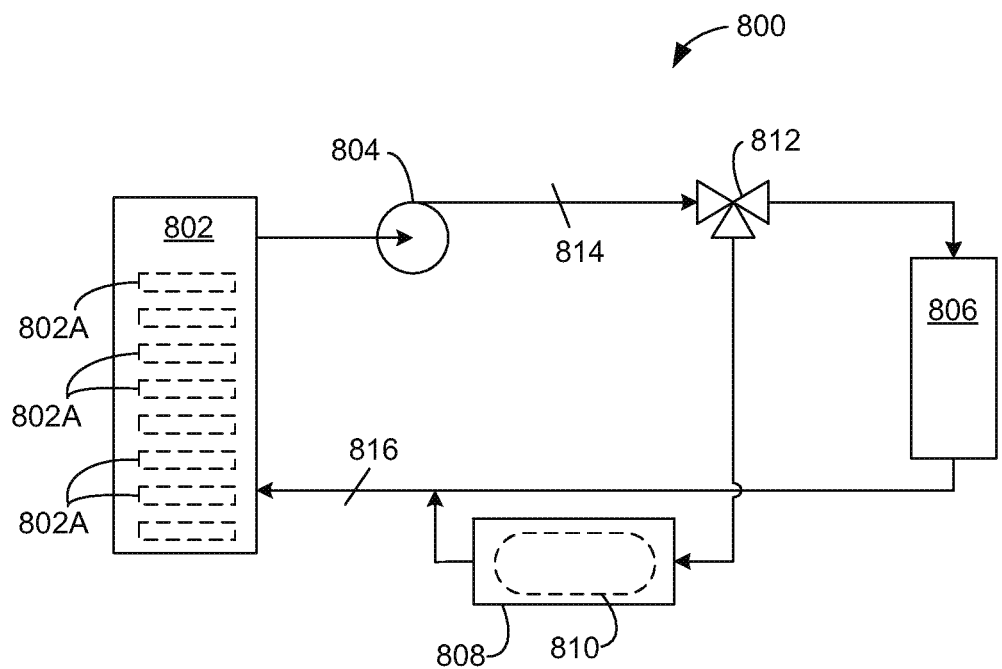
FIG. 8 depicts a block diagram of a system according to another embodiment.

FIG. 8 depicts a block diagram of a system 800 according to one embodiment. The system 800 is illustrative and non-limiting with respect to the present teachings. Thus, other systems can be configured and/or operated in accordance with the present teachings.

The system 800 includes a housing 802 including one or more heat-dissipating devices (i.e., thermal loads) 802A, a pump 804, a heat exchanger 806, and a heat storage device 808 including a phase-change material 810, that are respectively configured and operative as described above in regard to corresponding elements of the system 700.

The system 800 also includes diverting valve 812. The diverting valve 812 receives a flow of warmed coolant 814 and selectively routes that coolant to either the heat exchanger 806 or the heat storage device 808 according to a user setting of the valve or a control signal. During normal operation, a flow of chilled coolant 816 is provided to the housing 802 by way of the heat exchanger 806.

During times of excess heat load, or heat exchanger failure, the diverting valve 812 redirects the flow of warmed coolant 814 to the heat storage device 808. A flow of chilled coolant 816 is provided to the housing 802 by way of heat storage within the phase-change material 810.

Restoration of normal cooling results in the diverting valve 812 rerouting the flow of warmed coolant 814 to the heat exchanger 808. Heat is progressively rejected from the phase-change material 810 to the surroundings and the system 800 returns to normal operating temperatures. Other operational scenarios can also be used by way of the system 800.

First Illustrative Method

Figure 9:
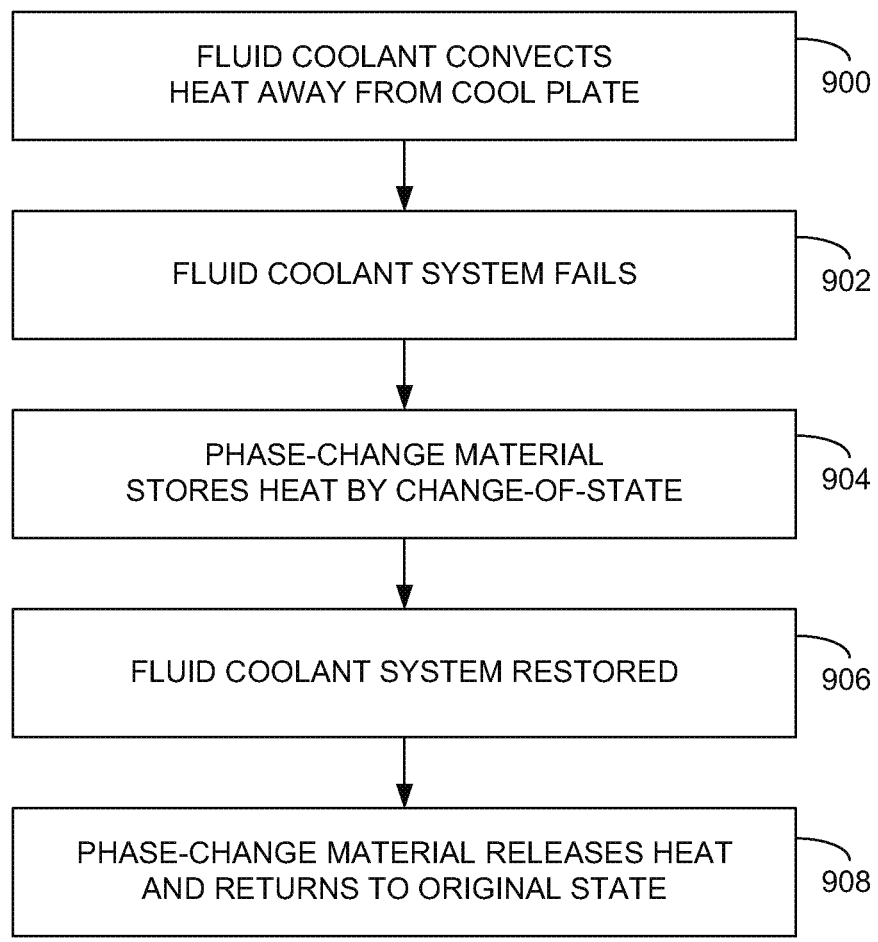
FIG. 9 is a flow diagram of a method according to one embodiment.

Attention is now directed to FIG. 9, which depicts a method according to one embodiment of the present teachings. The method of FIG. 9 depicts particular method steps and an order of execution. However, it is to be understood that other methods including other steps, omitting one or more of the depicted steps, or proceeding in other orders of execution are also contemplated. Thus, the method of FIG. 9 is illustrative and non-limiting with respect to the present teachings. Reference is made to FIG. 2 in the interest of understanding the method of FIG. 9.

At 900, a fluid coolant carries heat away from a cool plate by forced convection. For purpose of example, it is assumed that a chilled coolant flows through a cool plate (or heat sink) 202 by way of a fluid conduit 204. In so doing, heat from components 214 is rejected and the system 200 is in there equilibrium at some average, normal operating temperature.

At 902, a fluid coolant system failure occurs. For purposes of the ongoing example, it is assumed that the flow of coolant through the fluid conduit 204 stops abruptly due to a circulating pump failure.

At 904, heat is stored by a change of state of a phase-change material. For purposes of the example, heat from the components 214 is conducted to the phase-change material within the cavities 210 of the cool plate 202. In turn, the phase-change material progressively changes from solid to liquid state as the heat is stored. This operation occurs at a heat storage temperature slightly greater than the normal operating temperature of the system 200.

At 906, normal operations of the fluid coolant system are restored. For purposes of the example, it is assumed that the circulating pump is repaired as needed and returned to normal operation. Normal flow of coolant is thus restored.

At 908, heat stored within the phase-change materials is released and the phase-change material returns to its original solid state. For purposes of example, the phase-change material of the cool plate 202 releases stored heat to the flow of coolant within the fluid conduit 204. Forced convection carries the heat away, and the phase-change material progressively returns to a completely solid condition. Thermal equilibrium of the system 200 is eventually restored at a normal operating temperature.

In general, the foregoing description is intended to be illustrative and not restrictive. Many embodiments and applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

What is claimed is:

1. An apparatus, comprising:
   a heat sink formed from a thermally conductive material;
   a fluid conduit defined by the heat sink, the fluid conduit configured to route a flow of coolant through the heat sink from an inlet port to an outlet port;
   at least one internal cavity defined by the heat sink, wherein the at least one internal cavity is substantially coplanar with the fluid conduit within the heat sink; and
   a phase-change material supported in the at least one internal cavity, the phase-change material configured to change phase from a solid state to a liquid state at a predetermined heat storage temperature greater than a normal operating temperature.

2. The apparatus according to claim 1, the heat sink defining a heat transfer surface, the heat sink configured to receive heat from a load by way of the heat transfer surface.

3. The apparatus according to claim 1, the heat sink configured to store heat in the phase-change material when the heat sink is operating at about the predetermined heat storage temperature.

4. The apparatus according to claim 1, the heat sink configured to store heat in the phase-change material when a thermal flux from a load to the heat sink is greater than a thermal flux from the heat sink to a coolant flowing through the fluid conduit.

5. The apparatus according to claim 1, the heat sink configured to release heat from the phase-change material when a thermal flux from the heat sink to a coolant flowing through the fluid conduit is greater than a thermal flux from a load to the heat sink.

6. The apparatus according to claim 1, the heat sink configured such that heat is convected away from the heat sink by way of a flow of coolant through the fluid conduit.

7. The apparatus according to claim 1, the heat sink configured to be supported within a housing of a computer server.

8. The apparatus according to claim 1, the phase-change material selected such that the predetermined heat storage temperature is not more than five degrees Fahrenheit greater than the normal operating temperature.

9. The apparatus according to claim 1, the heat sink configured to achieve thermal equilibrium at the normal operating temperature by way of a flow of coolant through the fluid conduit.

10. The apparatus according to claim 1, the phase-change material selected so as to remain in a solid state at the normal operating temperature.

11. The apparatus according to claim 1 further comprising a cabinet configured to support a plurality of circuit cards, the heat sink configured to be supported within the cabinet.

12. The apparatus according to claim 11, the heat sink being fluidly coupled to a flow of coolant by way of the inlet port and the outlet port while supported within the cabinet.

13. A method, comprising:
storing heat within a phase-change material of a heat sink during a disruption of a normal flow of coolant through a fluid passageway of the heat sink;
restoring a normal flow of coolant through the fluid passageway of the heat sink; and
releasing the stored heat from the phase-change material to the normal flow of coolant.

14. The method according to claim 13 further comprising supporting the heat sink within a housing of a computer server during at least the storing heat within the phase-change material.

15. The method according to claim 13 further comprising supporting the heat sink in contact with a heat dissipating load.

\* \* \* \* \*